(12) United States Patent
Bae et al.

(10) Patent No.: US 10,351,738 B2
(45) Date of Patent: *Jul. 16, 2019

(54) PRESSURE-SENSITIVE ADHESIVE FILM AND METHOD OF MANUFACTURING ORGANIC ELECTRONIC DEVICE USING THE SAME

(71) Applicant: LG CHEM, LTD., Seoul (KR)

(72) Inventors: Kyung Yul Bae, Daejeon (KR); Hyun Jee Yoo, Daejeon (KR); Yoon Gyung Cho, Daejeon (KR); Se Woo Yang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 502 days.

This patent is subject to a terminal disclaimer.

(21) Appl. No.: 14/762,389

(22) PCT Filed: Aug. 5, 2014

(86) PCT No.: PCT/KR2014/007243
§ 371 (c)(1),
(2) Date: Jul. 21, 2015

(87) PCT Pub. No.: WO2015/020412
PCT Pub. Date: Feb. 12, 2015

(65) Prior Publication Data
US 2015/0368523 A1 Dec. 24, 2015

(30) Foreign Application Priority Data

Aug. 5, 2013 (KR) .................. 10-2013-0092782
Apr. 4, 2014 (KR) .................. 10-2014-0040825

(51) Int. Cl.
| | | |
|---|---|---|
| C09J 123/22 | (2006.01) | |
| C09J 109/00 | (2006.01) | |
| H01L 51/00 | (2006.01) | |
| H01L 51/56 | (2006.01) | |
| H01L 51/52 | (2006.01) | |
| C09J 9/00 | (2006.01) | |
| C09J 4/00 | (2006.01) | |
| C09J 7/00 | (2018.01) | |
| C09J 133/08 | (2006.01) | |
| C09J 145/00 | (2006.01) | |
| C09J 7/20 | (2018.01) | |
| C09J 7/10 | (2018.01) | |

(52) U.S. Cl.
CPC .............. *C09J 109/00* (2013.01); *C09J 4/00* (2013.01); *C09J 7/00* (2013.01); *C09J 7/10* (2018.01); *C09J 7/20* (2018.01); *C09J 9/00* (2013.01); *C09J 123/22* (2013.01); *C09J 133/08* (2013.01); *C09J 145/00* (2013.01); *H01L 51/0001* (2013.01); *H01L 51/004* (2013.01); *H01L 51/0026* (2013.01); *H01L 51/0043* (2013.01); *H01L 51/0094* (2013.01); *H01L 51/5237* (2013.01); *H01L 51/5246* (2013.01); *H01L 51/5253* (2013.01); *H01L 51/5256* (2013.01); *H01L 51/5259* (2013.01); *H01L 51/56* (2013.01); *C09J 2201/36* (2013.01); *C09J 2201/606* (2013.01); *C09J 2203/326* (2013.01); *C09J 2205/114* (2013.01); *C09J 2409/00* (2013.01); *C09J 2415/003* (2013.01); *C09J 2423/00* (2013.01); *C09J 2423/003* (2013.01); *C09J 2433/003* (2013.01); *Y10T 428/2883* (2015.01)

(58) Field of Classification Search
None
See application file for complete search history.

(56) References Cited

U.S. PATENT DOCUMENTS

| | | | | |
|---|---|---|---|---|
| 4,133,731 | A * | 1/1979 | Hansen | C08F 287/00 428/461 |
| 5,182,786 | A | 1/1993 | Kinaga et al. | |
| 9,708,511 | B2 * | 7/2017 | Choi | C09J 119/00 |
| 9,803,112 | B2 * | 10/2017 | Yoo | C09J 7/02 |
| 2011/0105637 | A1 * | 5/2011 | Fujita | C08L 23/22 522/120 |
| 2014/0217621 | A1 * | 8/2014 | Yoo | B32B 3/04 257/788 |
| 2014/0322526 | A1 | 10/2014 | Dollase et al. | |
| 2015/0188085 | A1 | 7/2015 | Yoo et al. | |
| 2015/0299523 | A1 * | 10/2015 | Park | C09J 7/02 428/354 |

(Continued)

FOREIGN PATENT DOCUMENTS

| | | |
|---|---|---|
| CN | 101151343 A | 3/2008 |
| DE | 10-2009-012272 A1 | 9/2010 |

(Continued)

OTHER PUBLICATIONS

Ha Kyoung Jin et al., abstract of Korean Patent Application Publication 20130063938A, Jun. 17, 2013.*
Choi, Tae Yi, et al., "Adhesive Composition with Excellent Durability", machine translation of KR 20150024593A, published on Mar. 9, 2015 (Year: 2015).*

*Primary Examiner* — Anish P Desai

(74) *Attorney, Agent, or Firm* — Dentons US LLP

(57) ABSTRACT

Provided are a pressure-sensitive adhesive film and a method of manufacturing an organic electronic device using the same. The pressure-sensitive adhesive film that may effectively block moisture or oxygen from penetrating into an organic electronic device from an external environment, and exhibit reliability under harsh conditions such as high temperature and high humidity and excellent optical characteristics is provided.

15 Claims, 1 Drawing Sheet

(56) References Cited

U.S. PATENT DOCUMENTS

| | | | | |
|---|---|---|---|---|
| 2015/0376468 A1* | 12/2015 | Cho | ............................ | C09J 7/02 257/40 |
| 2015/0376469 A1* | 12/2015 | Bae | ............................ | C09J 7/02 257/40 |
| 2016/0046841 A1* | 2/2016 | Cho | ............................ | C09J 7/02 257/40 |

FOREIGN PATENT DOCUMENTS

| | | | | |
|---|---|---|---|---|
| EP | 2610319 A1 | 7/2013 | | |
| JP | 2706285 B2 | 1/1998 | | |
| JP | 2004-307579 A | 11/2004 | | |
| JP | 2010-209168 A | 9/2010 | | |
| JP | 2013-120804 A | 6/2013 | | |
| KR | 10-2006-0106721 A | 10/2006 | | |
| KR | 10-2008-0088606 A | 10/2008 | | |
| KR | 10-2013-0063938 A | 6/2013 | | |
| KR | 10-2013-0081261 A | 7/2013 | | |
| TW | 201002796 A | 1/2010 | | |
| TW | 201329178 A | 7/2013 | | |
| WO | 2006107748 A1 | 10/2006 | | |
| WO | 2007111607 A1 | 10/2007 | | |
| WO | 2008144080 A1 | 11/2008 | | |
| WO | 2013057264 A1 | 4/2013 | | |
| WO | 2013/103281 A1 | 7/2013 | | |
| WO | WO-2013103284 A1 * | 7/2013 | ............... | B32B 3/04 |
| WO | WO-2015030375 A1 * | 3/2015 | ............ | C09J 119/00 |
| WO | 2015129625 A1 | 9/2015 | | |

\* cited by examiner

PRESSURE-SENSITIVE ADHESIVE FILM AND METHOD OF MANUFACTURING ORGANIC ELECTRONIC DEVICE USING THE SAME

This application is a 35 USC § 371 National Stage entry of International Application No. PCT/KR2014/007243 filed on Aug. 5, 2014, and claims the benefit of Korean Application No. 10-2013-0092782 filed on Aug. 5, 2013, and Korean Application No. 10-2014-0040825 filed on Apr. 4, 2014 all of which are incorporated by reference in their entirety for all purposes as if fully set forth herein.

BACKGROUND

1. Field of the Invention

The present invention relates to a pressure-sensitive adhesive film, and a method of manufacturing an organic electronic device using the same.

2. Discussion of Related Art

An organic electronic device (OED) refers to a device including an organic material layer generating a flow of electric charges using holes and electrons, and may include, for example, a photovoltaic device, a rectifier, a transmitter and an organic light emitting diode (OLED).

A representative OED, which is an OLED, has less power consumption and a higher response speed, and forms a thinner display device or light than a conventional light source. In addition, the OLED has excellent space utilization, and is expected to be applied in various fields including all types of portable devices, monitors, notebook computers and TVs.

To extend commercialization and use of the OLED, a major problem is durability. Organic materials and metal electrodes included in the OLED are very easily oxidized by external factors such as water. Accordingly, a product including the OLED is very sensitive to environmental factors. Therefore, various methods for preventing penetration of oxygen or water from an external environment with respect to an organic electronic device such as the OLED have been suggested.

In Korean Unexamined Patent No. 2008-0088606, an adhesive capsulated composition film and an organic electroluminescent light emitting device are provided, and have poor processability as a pressure-sensitive adhesive based on polyisobutylene (PIB), and low reliability at a high temperature and high humidity.

Accordingly, in an organic electronic device, it is required to develop an encapsulant ensuring a required lifespan, effectively preventing penetration of moisture, maintaining reliability at a high temperature and high humidity, and having excellent optical characteristics.

SUMMARY OF THE INVENTION

The present invention is directed to providing a pressure-sensitive adhesive film which can have a structure effectively preventing moisture or oxygen from penetrating into an organic electronic device from an external environment, and excellent mechanical characteristics such as handleability and processability and excellent transparency, and a method of manufacturing an organic electronic device using the same.

In one aspect, the present invention provides a pressure-sensitive adhesive film. The pressure-sensitive adhesive film may be applied to, for example, encapsulation or capsulation of an organic electronic device such as an OLED.

The term "organic electronic device" used herein refers to a product or device having a structure including an organic material layer generating alternation of electric charges using holes and electrons between a pair of electrodes facing each other, and may include, but is not limited to, for example, a photovoltaic device, a rectifier, a transmitter, and an organic light emitting diode (OLED). In one example, the organic electronic device may be an OLED.

In an exemplary embodiment of the present invention, the pressure-sensitive adhesive film of the present invention satisfies Equation 1:

$$S \leq 3.5 \text{ }\mu\text{m/min} \qquad \text{[Equation 1]}$$

In Equation, 1, S is a dimension variation with respect to a longitudinal direction of the film between 40 to 120 minutes, which is measured through thermomechanical analysis (TMA) when the film laminated to a thickness of 600 μm is treated with heat at 80° C. for 120 minutes. On the other hand, S may be represented by $(I_{120}-I_{40}) \times 100/80$ min. Here, $I_{120}$ refers to a dimension (μm) with respect to a longitudinal direction of the film at 120 minutes when the laminated film is treated with heat at 80° C. for 120 minutes, and $I_{40}$ refers to a dimension (μm) with respect to a longitudinal direction of the film at 40 minutes.

The term "thermomechanical analysis (TMA)" used herein refers to a device for measuring size change caused by expansion and contraction of a specific sample. According to a TMA measurement method, expansion and contraction of a specific sample caused by heat treatment under a load of approximately 0 may be measured.

In Equation 1, the lower limit of the dimension variation S with respect to the longitudinal direction of the film may be, but is not particularly limited to, 0.01 or 0 μm/min. The dimension variation may represent durability and reliability with respect to a high temperature when a pressure-sensitive adhesive is formed in a film. In addition, for example, S may be 0 to 3.3, 0 to 3.0, 0 to 2.8, 0 to 2.5, 0.01 to 2.3, 0.01 to 2.0, 0.01 to 1.8, 0.01 to 1.5, 0.01 to 1.3, or 0.01 to 1.0 μm/min. As the dimension variation S is controlled to be 3.5 μm/min or less, impurities or bubbles generated when the film is exposed to a high temperature for a long time may be prevented. That is, the present invention provides a pressure-sensitive adhesive composition for encapsulating an organic electronic device, which has an improved moisture barrier ability and heat resistance, thereby realizing durability and reliability with respect to high temperature.

In addition, the pressure-sensitive adhesive film according to the present invention may have a water vapor transmission rate (WVTR) measured with respect to a thickness direction of the film after being manufactured to have a thickness of 100 μm, of 50, 40, 30, 20, or 10 g/m²·day or less at 100° F. and a relative humidity of 100%. As a composition ratio or crosslinking condition of a pressure-sensitive adhesive including the pressure-sensitive adhesive composition is controlled to have such a WVTR, when being applied to the encapsulation or capsulation structure of the electronic device, an encapsulation or capsulation structure that can stably protect an element by effectively blocking moisture or oxygen from penetrating from an external environment may be realized. As the WVTR is decreased, an excellent moisture barrier ability may be exhibited, and thus the lower limit may be, but is not particularly limited to, for example, 0 g/m²·day.

In addition, the pressure-sensitive adhesive film may have an excellent light transmittance with respect to the visible-ray region. In one example, the pressure-sensitive adhesive film of the present invention may have a light transmittance of 85% or more with respect to the visible-ray region. For example, the pressure-sensitive adhesive film may have a light transmittance of 85, 87, or 90% or more with respect to the visible-ray region. In addition, the pressure-sensitive adhesive film may have excellent light transmittance and low haze. In one example, the pressure-sensitive adhesive film may have a haze of 3, 2, 1, 0.8, 0.5, or 0.3% or less. Here, the light transmittance of the pressure-sensitive adhesive film is measured at 550 nm using a UV-VIS spectrometer, and the haze of the pressure-sensitive adhesive film is measured using a haze meter according to a JIS K 7105 standard test method. The pressure-sensitive adhesive film of the present invention may have excellent reliability at a high temperature and high humidity and excellent optical characteristics due to satisfying the dislocated distance according to Equation 1 as described above.

The pressure-sensitive adhesive film of the present invention may include a pressure-sensitive adhesive, which may be layered. A material for the pressure-sensitive adhesive composition constituting the pressure-sensitive adhesive is not particularly limited as long as the pressure-sensitive adhesive film satisfies Equation 1. For example, the pressure-sensitive adhesive composition may include an encapsulating resin and a multifunctional active energy ray-polymerizable compound that can be polymerized by irradiation with an active energy ray.

In one exemplary embodiment of the present invention, the encapsulating resin may have a glass transition temperature of less than 0, −10, −30, −50, or −60° C. Here, the glass transition temperature may refer to a glass transition temperature after UV rays are irradiated at a dose of approximately 1 J/cm$^2$ or more, or a glass transition temperature after thermal curing is additionally performed after UV irradiation.

In one example, the encapsulating resin may be a styrene-based resin or elastomer, a polyolefin-based resin or elastomer, other elastomers, a polyoxyalkylene-based resin or elastomer, a polyester-based resin or elastomer, a polyvinylchloride-based resin or elastomer, a polycarbonate-based resin or elastomer, a polyphenylenesulfide-based resin or elastomer, a mixture of hydrocarbons, a polyamide-based resin or elastomer, an acrylate-based resin or elastomer, an epoxy-based resin or elastomer, a silicon-based resin or elastomer, a fluorine-based resin or elastomer, or a mixture thereof.

Here, the styrene-based resin or elastomer may be, for example, a styrene-ethylene-butadiene-styrene (SEBS) block copolymer, a styrene-isoprene-styrene (SIS) block copolymer, an acrylonitrile-butadiene-styrene (ABS) block copolymer, an acrylonitrile-styrene-acrylate (ASA) block copolymer, a styrene-butadiene-styrene (SBS) block copolymer, a styrene-based homopolymer or a mixture thereof. The olefin-based resin or elastomer may be, for example, a high density polyethylene-based resin or elastomer, a low density polyethylene-based resin or elastomer, a polypropylene-based resin or elastomer or a mixture thereof. The elastomer may be, for example, an ester-based thermoplastic elastomer, an olefin-based elastomer, a silicon-based elastomer, an acrylic elastomer or a mixture thereof. Among these, the olefin-based thermoplastic elastomer may be a polybutadiene resin or elastomer or a polyisobutylene resin or elastomer. The polyoxyalkylene-based resin or elastomer may be, for example, a polyoxymethylene-based resin or elastomer, a polyoxyethylene-based resin or elastomer or a mixture thereof. The polyester-based resin or elastomer may be, for example, a polyethylene terephthalate-based resin or elastomer, a polybutylene terephthalate-based resin or elastomer or a mixture thereof. The polyvinylchloride-based resin or elastomer may be, for example, polyvinylidene chloride. The encapsulating resin may include a mixture resin of hydrocarbons, for example, hexatriacontane or paraffin. The polyamide-based resin or elastomer may be, for example, nylon. The acrylate-based resin or elastomer may be, for example, polybutyl(meth)acrylate. The epoxy-based resin or elastomer may be, for example, a bisphenol-type such as a bisphenol A-type, a bisphenol F-type, a bisphenol S-type, and a hydrogenated product thereof; a novolac-type such as a phenolnovolac-type or a cresolnovolac-type; a nitrogen-containing ring-type such as a triglycidylisocyanurate-type or a hydantoin-type; an alicyclic-type; an aliphatic-type; an aromatic-type such as a naphthalene-type or a biphenyl-type; a glycidyl-type such as a glycidylether-type, a glycidylamine-type, or a glycidylester-type; a dicyclo-type such as dicyclopentadiene-type; an ester-type; an etherester-type; or a mixture thereof. The silicon-based resin or elastomer may be, for example, polydimethylsiloxane. In addition, the fluorine-based resin or an elastomer may be a polytrifluoroethylene resin or elastomer, a polytetrafluoroethylene resin or elastomer, a polychlorotrifluoroethylene resin or elastomer, a polyhexafluoropropylene resin or elastomer, polyvinylidene fluoride, polyvinyl fluoride, polyethylenepropylene fluoride, or a mixture thereof.

The above-listed resins or elastomers may be grafted to, for example, maleic anhydride, copolymerized with another one of the listed resins or elastomers or a monomer for preparing the resin or elastomer, or modified by a compound, other than the above-used resins or elastomers. The compound may be a carboxyl-terminated butadiene-acrylonitrile copolymer.

In one example, the pressure-sensitive adhesive composition is an encapsulating resin, which may include an olefin-based elastomer, a silicon-based elastomer, or an acrylic elastomer of the above-described types, but the present invention is not limited thereto.

Specifically, the encapsulating resin may be a copolymer of a diene and an olefin-based compound having one carbon-carbon double bond. Here, the olefin-based compound may include isobutylene, propylene, or ethylene, and the diene may be a monomer capable of being polymerized with the olefin-based compound, for example, 1-butene, 2-butene, isoprene, or butadiene. That is, the encapsulating resin of the present invention may be, for example, a homopolymer of an isobutylene monomer; a copolymer prepared by copolymerizing an isobutylene monomer with a monomer capable of being polymerized therewith; or a mixture thereof. In one example, the copolymer of the diene and the olefin-based compound having one carbon-carbon double bond may be a butyl rubber. When a specific resin is used as described above, a moisture barrier ability that can be achieved in the present invention may be satisfied. In addition, the present invention may improve humidity resistance and heat resistance by preparing a specific composition satisfying Equation 1 described above due to low heat resistance, while a conventional isobutylene polymer has low moisture permeability.

In the pressure-sensitive adhesive composition, the resin or elastomer component may have a weight average molecular weight (Mw) to an extent that the pressure-sensitive adhesive composition can be plasticized into a film shape. For example, the resin or elastomer may have a weight average molecular weight (Mw) of approximately 100,000 to 2,000,000, 100,000 to 1,500,000, or 100,000 to 1,000,000. The term "weight average molecular weight" used herein refers to a converted value with respect to standard polystyrene measured by gel penetration chromatography (GPC). However, the resin or elastomer component does not necessarily have the above-mentioned weight average molecular weight. For example, when a molecular weight of the resin or elastomer component is not sufficient for forming a film, a separate binder resin may be blended into the pressure-sensitive adhesive composition.

In addition, the pressure-sensitive adhesive composition of the present invention may have a high compatibility with an encapsulating resin, and include an active energy ray-polymerizable compound that can form a specific crosslinking structure with the encapsulating resin.

For example, the pressure-sensitive adhesive composition of the present invention may include a multifunctional active-energy ray polymerizable compound that can be polymerized by irradiation of an active energy ray in addition to the encapsulating resin. The active energy ray-polymerizable compound may refer to, for example, a compound including at least two functional groups that can participate in a polymerization reaction by irradiation of an active energy ray, for example, a functional group including an ethylene-like unsaturated double bond such as an acryloyl group or a methacryloyl group, and a functional group such as an epoxy group or an oxetane group.

As the multifunctional active energy ray-polymerizable compound, for example, a multifunctional acrylate (MFA) may be used.

In addition, the multifunctional active energy ray-polymerizable compound that can be polymerized by the irradiation of an active energy ray may satisfy Formula 1. In addition, the active energy ray-polymerizable compound may be included at 5 to 30, 5 to 25, 8 to 20, 10 to 18, or 12 to 18 parts by weight relative to 100 parts by weight of the encapsulating resin.

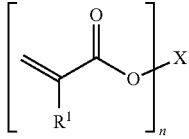

[Formula 1]

In Formula 1, $R_1$ is hydrogen or an alkyl group having 1 to 4 carbon atoms, n is an integer of 2 or more, and X is a residue derived from a linear, branched, or cyclic alkyl group having 3 to 30 carbon atoms. Here, when X is a residue derived from a cyclic alkyl group, X may be, for example, a residue derived from a cyclic alkyl group having 3 to 30, 6 to 28, 8 to 22, or 12 to 20 carbon atoms. In addition, when X is a residue derived from a linear alkyl group, X may be a residue derived from a linear alkyl group having 3 to 30, 6 to 25, or 8 to 20 carbon atoms. In addition, when X is a residue derived from a branched alkyl group, X may be a residue derived from a branched alkyl group having 3 to 30, 5 to 25, or 6 to 20 carbon atoms.

The term "residue derived from an alkyl group" used herein may refer to a residue of a specific compound composed of an alkyl group. In one example, in Formula 1, when n is 2, X may be an alkylene group. In addition, when n is 3 or more, at least two hydrogen atoms are released from the alkyl group, and therefore X may bind to a (meth) acryloyl group of Formula 1.

The term "alkyl group" used herein may refer to, unless particularly defined otherwise, an alkyl group having 1 to 30, 1 to 25, 1 to 20, 1 to 16, 1 to 12, 1 to 8, or 1 to 4 carbon atoms. The alkyl group may have a linear, branched, or cyclic structure, and may be optionally substituted by at least one substituent.

The term "alkylene group" used herein may be, unless particularly defined otherwise, an alkylene group having 2 to 30, 2 to 25, 2 to 20, 2 to 16, 2 to 12, 2 to 10, or 2 to 8 carbon atoms. The alkylene group may have a linear, branched, or cyclic structure, and may be optionally substituted by at least one substituent.

The term "alkoxy group" used herein may be, unless particularly defined otherwise, an alkoxy group having 1 to 20, 1 to 16, 1 to 12, 1 to 8, or 1 to 4 carbon atoms. The alkoxy group may be a linear, branched, or cyclic type. In addition, the alkoxy group may be optionally substituted by at least one substituent.

The multifunctional active energy ray-polymerizable compound that can be polymerized by the irradiation of an active energy ray may be any compound satisfying Formula 1 without limitation. For example, the compound may be 1,4-butanediol di(meth)acrylate, 1,3-butylene glycol di(meth)acrylate, 1,6-hexanediol di(meth)acrylate, 1,8-octanediol di(meth)acrylate, 1,12-dodecanediol di(meth)acrylate, neopentylglycol di(meth)acrylate, dicyclopentanyl di(meth)acrylate, cyclohexane-1,4-dimethanol di(meth)acrylate, tricyclodecanedimethanol (meth)diacrylate, dimethylol dicyclopentane di(meth)acrylate, neopentyl glycol modified trimethylpropane di(meth)acrylate, adamantane di(meth)acrylate, trimethylolpropane tri(meth)acrylate, or a mixture thereof.

As the multifunctional active energy ray-polymerizable compound, for example, a compound having a molecular weight of less than 1,000 and including at least two functional groups may be used. In this case, the molecular weight may refer to a weight average molecular weight or a conventional molecular weight. A cyclic structure included in the multifunctional active energy ray-polymerizable compound may be any one of a carbocyclic structure, a heterocyclic structure, a monocyclic structure, and a polycyclic structure.

In one exemplary embodiment of the present invention, the pressure-sensitive adhesive composition may include a silane compound satisfying Formula 2:

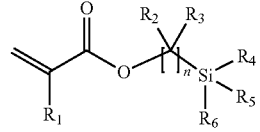

[Formula 2]

In Formula 2, $R_1$ is hydrogen or an alkyl group. $R_1$ may be, for example, an alkyl group having 1 to 4 or 1 to 2 carbon atoms. In addition, in Formula 2, $R_2$ and $R_3$ are each independently hydrogen, or a linear, branched, or cyclic alkyl group, or $R_2$ is linked with $R_3$, thereby forming a cyclic alkyl group. For example, $R_2$ and $R_3$ may be each independently hydrogen, or a linear, branched or cyclic alkyl group. Here, the linear alkyl group may have 1 to 10, 1 to 6, or 1 to 4 carbon atoms, the branched alkyl group may have 3 to 10, 3 to 6, or 3 to 4 carbon atoms, and the cyclic alkyl group may have 3 to 10, 3 to 8, 3 to 6, or 3 to 4 carbon atoms. In addition, $R_2$ may be linked with $R_3$, thereby forming a cyclic alkyl group having 2 to 10, 3 to 10, 4 to 9, or 4 to 8 carbon atoms. In addition, in Formula 2, $R_4$, $R_5$ and $R_6$ may be each independently hydrogen, an alkyl group or an alkoxy group, at least one of $R_4$, $R_5$ and $R_6$ is an alkoxy group, and n is an integer of 1 or more. Specifically, $R_4$, $R_5$, and $R_6$ may be each independently an alkyl group having 1 to 10, 1 to 6, 1 to 4, or 1 to 2 carbon atoms; or an alkoxy group having 1 to 10, 1 to 8, 1 to 4, or 1 to 2 carbon atoms. Here, at least one of $R_4$, $R_5$, and $R_6$ may be an alkoxy group, and all of $R_4$, $R_5$, and $R_6$ may be alkoxy groups, but the present invention is not limited thereto. In one example, the silane compound is not particularly limited, as long as it satisfies Formula 2, and may be, for example, 3-methacryloxypropyl trimethoxysilane, 3-methacryloxy propyl triethoxysilane, 3-acryloxy propyl trimethoxysilane, 3-acryloxy propyl triethoxysilane, 3-methacryloxy methyl triethoxysilane, 3-methacryloxy methyl trimethoxysilane, 3-acryloxy propyl methyldimethoxysilane, methacryloxy methyl methyldimethoxysilane, methacryloxy methyl methyldiethoxysilane, methacryloxy propyl methyldimethoxysilane, methacryloxy propyl methyldiethoxysilane, methacryloxy propyl dimethylmethoxysilane, or methacryloxy propyl dimethylethoxysilane. An acryl group of the silane compound may serve to increase an interface pressure-sensitive adhesive strength by being crosslinked with the encapsulating resin or active energy ray-polymerizable compound of the pressure-sensitive adhesive composition. The silane compound may be included at, for example, 0.1 to 10, 0.5 to 8, 0.8 to 5, 1 to 5, 1 to 4.5, or 1 to 4 parts by weight relative to 100 parts by weight of the encapsulating resin.

In one example, the active energy ray-polymerizable compound may form a crosslinking structure with the silane compound satisfying Formula 2, and the crosslinking structure may form a semi-interpenetrating polymer network (semi-IPN) with the encapsulating resin. That is, the pressure-sensitive adhesive composition may include a semi-IPN. The term "semi-IPN" includes at least one polymer crosslinking structure (polymer network) and at least one linear or branched polymer, and at least a part of the linear or branched polymer has a structure penetrating into the polymer crosslinking structure. The semi-IPN may be distinguished from an IPN structure since the linear or branched polymer is theoretically separated from the polymer crosslinking structure without loss of a chemical bond.

In one exemplary embodiment, the crosslinking structure may be a crosslinking structure formed by application of heat, a crosslinking structure formed by irradiation of an active energy ray or a crosslinking structure formed by aging at room temperature. Here, in the category of the "active energy ray", a microwave, an infrared (IR) ray, an ultraviolet (UV) ray, an X ray and a gamma ray, and a particle beam such as an alpha-particle beam, a proton beam, a neutron beam or an electron beam, and conventionally, an UV ray and an electron beam may be included. As such a semi-IPN structure is introduced, a mechanical property such as processability of the pressure-sensitive adhesive composition may be increased, a humidity-resistant adhesive performance is improved, transparency is realized, a previously unattainable high moisture barrier performance is improved, and an excellent panel lifespan may be realized.

In one example, the active energy ray-polymerizable compound may form a crosslinking structure with the silane compound satisfying Formula 2, and the encapsulating resin may form a crosslinking structure with the active energy ray-polymerizable compound or the silane compound satisfying Formula 2, thereby forming an interpenetrating polymer network (IPN) structure. In addition, the term "IPN structure" refers to a state in which at least two crosslinking structures are present in a pressure-sensitive adhesive. In one example, the IPN structure may refer to a structure including at least two crosslinking structures in an intertwining, entanglement, or penetrating state. For example, the composition of the present invention may include a crosslinking structure of an encapsulating resin (hereinafter, referred to as a "first crosslinking structure") and a crosslinking structure formed by a reaction of an active energy ray-polymerizable compound and the silane compound satisfying Formula 2 (hereinafter, referred to as a "second crosslinking structure"), and the first and second crosslinking structures may be in an penetrating state or an entanglement state. As the pressure-sensitive adhesive composition includes a semi-IPN or IPN structure in a crosslinked state, excellent heat resistance of the pressure-sensitive adhesive at a high temperature may be maintained, and a decrease in an interface durability caused by moisture penetration may be prevented.

In an exemplary embodiment of the present invention, the pressure-sensitive adhesive composition may further include a radical initiator that can induce a polymerization reaction of the above-described active energy ray-polymerizable compound. The radical initiator may be a photoinitiator or a thermal initiator. A specific type of the photoinitiator may be suitably selected in consideration of a curing rate and possibility of yellowing. For example, as the photoinitiator, a benzoin-, hydroxy ketone-, amino ketone- or phosphine oxide-based photoinitiator, and specifically, benzoin, benzoin methylether, benzoin ethylether, benzoin isopropylether, benzoin n-butylether, benzoin isobutylether, acetophenone, dimethylamino acetophenone, 2,2-dimethoxy-2-phenylacetophenone, 2,2-diethoxy-2-phenylacetophenone, 2-hydroxy-2-methyl-1-phenylpropane-1one, 1-hydroxycyclohexylphenylketone, 2-methyl-1-[4-(methylthio)phenyl]-2-morpholino-propane-1-one, 4-(2-hydroxyethoxy)phenyl-2-(hydroxy-2-propyl)ketone, benzophenone, p-phenylbenzophenone, 4,4'-diethylaminobenzophenone, dichlorobenzophenone, 2-methylanthraquinone, 2-ethylanthraquinone, 2-t-butylanthraquinone, 2-aminoanthraquinone, 2-methyl thioxanthone, 2-ethylthioxanthone, 2-chlorothioxanthone, 2,4-dimethylthioxanthone, 2,4-diethylthioxanthone, benzyldimethylketal, acetophenone dimethylketal, p-dimethylamino benzoic acid ester, oligo[2-hydroxy-2-methyl-1-[4-(1-methylvinyl)phenyl]propanone], or 2,4,6-trimethylbenzoyl-diphenyl-phosphineoxide may be used.

The radical initiator may be included at 0.2 to 20, 0.5 to 18, 1 to 15, or 2 to 13 parts by weight relative to 100 parts by weight of the active energy ray-polymerizable compound. Accordingly, the reaction of the active energy ray-polymerizable compound is effectively induced, and degradation of physical properties of the pressure-sensitive adhesive composition due to residual components after curing may be prevented.

In one example, the pressure-sensitive adhesive composition may further include a tackifier. The tackifier may be a hydrogenated cyclic olefin-based polymer. As the tackifier, for example, a hydrogenated petroleum resin obtained by hydrogenating a petroleum resin may be used. The hydrogenated petroleum resin may be partially or completely hydrogenated, and may be a mixture of such resins. Such a tackifier may have a high compatibility with the pressure-sensitive adhesive composition, an excellent moisture barrier ability, and a small content of an organic volatile component. A specific example of the hydrogenated petroleum resin may be a hydrogenated terpene-based resin, a hydrogenated ester-based resin, or a hydrogenated dicyclopentadiene-based resin. The tackifier may have a weight average molecular weight of approximately 200 to 5,000. A content of the tackifier may be suitably controlled as needed.

For example, the content of the tackifier may be selected in consideration of a gel content that will be described below. According to one example, the tackifier may be included at 5 to 100, 8 to 95, 10 to 93, or 15 to 90 parts by weight relative to 100 parts by weight of a solid content of the pressure-sensitive adhesive composition.

The pressure-sensitive adhesive composition may further include a moisture absorbent when needed. The term "moisture absorbent" may refer to a material that can remove moisture or vapor which has penetrated into the following pressure-sensitive adhesive film through a chemical reaction. When the pressure-sensitive adhesive composition of the present invention includes a moisture absorbent, to be formed in a film, the light transmittance described below may not be realized, but an excellent moisture barrier ability may be realized. Specifically, the pressure-sensitive adhesive composition may be formed in a film to be applied to encapsulation of an organic electronic device. In this case, when the pressure-sensitive adhesive composition does not include a moisture absorbent and exhibits excellent transparency, it may be applied to encapsulation of a top-emissive organic electronic device, or when the pressure-sensitive adhesive composition includes a moisture absorbent and exhibits an excellent moisture barrier ability, it may be applied to encapsulation of a bottom-emissive organic electronic device. However, the present invention is not limited thereto. That is, when the pressure-sensitive adhesive composition does not include a moisture absorbent and exhibits excellent transparency, it may be applied to encapsulation of a bottom-emissive organic electronic device.

For example, the moisture absorbent may be present while being uniformly dispersed in the pressure-sensitive adhesive composition or the pressure-sensitive adhesive layer described below. Here, the uniformly dispersed state may mean a state in which the moisture absorbent is present in any everypart of the pressure-sensitive adhesive composition or the pressure-sensitive adhesive layer at the same or substantially the same density. As the moisture absorbent used herein, for example, a metal oxide, a sulfate, or an organic metal oxide may be used. Specifically, the sulfate may be magnesium sulfate, sodium sulfate, or nickel sulfate, and the organic metal oxide may be aluminum oxide octylate. Here, the metal oxide may be phosphorus pentoxide ($P_2O_5$), lithium oxide ($Li_2O$), sodium oxide ($Na_2O$), barium oxide (BaO), calcium oxide (CaO), or magnesium oxide (MgO), and the metal salt may be a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$), or magnesium iodide ($MgI_2$); or a metal chlorate such as barium perchlorate ($Ba(ClO_4)_2$) or magnesium perchlorate ($Mg(ClO_4)_2$), but the present invention is not limited thereto. As the moisture absorbent that can be included in the pressure-sensitive adhesive composition, one or at least two of the above-described materials may be used. In one example, when at least two of the above materials are used, the moisture absorbent may be calcined dolomite.

Such a moisture absorbent may be controlled to a suitable size according to its use. In one example, an average diameter of the moisture absorbent may be controlled to approximately 10 to 15000 nm. A moisture absorbent having the above range of the average diameter may be easy to store due to a not too high reaction rate with moisture, and may effectively remove moisture without damage to an element to be encapsulated.

A content of the moisture absorbent may be suitably selected without particular limitation in consideration of a desired barrier characteristic.

The pressure-sensitive adhesive composition may further include a moisture blocker when needed. The term "moisture blocker" used herein may refer to a material that can block or prevent migration of moisture or vapor in the film while having little or no reactivity with moisture. As the moisture blocker, one or at least two of clay, talc, a pin-type silica, a planar silica, a porous silica, zeolite, titania, and zirconia may be used. In addition, a surface of the water blocker may be treated with an organic modifier to facilitate penetration of an organic material. As such an organic modifier, for example, dimethyl benzyl hydrogenated tallow quaternary ammonium, dimethyl hydrogenated tallow quaternary ammonium, methyl tallow bis-2-hydroxyethyl quaternary ammonium, dimethyl hydrogenated tallow 2-ethylhexyl quaternary ammonium, dimethyl dehydrogenated tallow quaternary ammonium, or a mixture thereof may be used.

A content of the moisture blocker may be suitably selected without particular limitation in consideration of a desired blocking characteristic.

In addition to the above-described components, various additives may be included in the pressure-sensitive adhesive composition according to its use and a process of manufacturing a pressure-sensitive adhesive film that will be described below. For example, the pressure-sensitive adhesive composition may include a curable material, a crosslinking agent, or a filler at a suitable range of content according to a desired physical property.

In one example, the pressure-sensitive adhesive film including a pressure-sensitive adhesive of the present invention may have a gel content represented by Equation 2 of 50% or more.

$$\text{Gel content (\%)}=B/A \times 100 \qquad \text{[Equation 2]}$$

In Equation 2, A is a mass of the pressure-sensitive adhesive, and B is a dry mass of an insoluble content of the pressure-sensitive adhesive remaining after being dipped in toluene at 60° C. for 24 hours and filtered through a 200-mesh sieve (pore size of 200 µm).

The gel content represented by Equation 2 may be 50 to 99%, 50 to 90%, 50 to 80%, or 50 to 70%. That is, in the present invention, a pressure-sensitive adhesive composition having an excellent moisture barrier characteristic, reliability, and optical characteristic may be realized by determining a crosslinking structure and a suitable range of the degree of crosslinking of the pressure-sensitive adhesive composition from the gel content.

In an exemplary embodiment of the present invention, the pressure-sensitive adhesive film may be formed in a monolayer structure as described above, or may be formed of at least two layers that will be described below. For example, the pressure-sensitive adhesive film may include a first layer including the above-described pressure-sensitive adhesive and a second layer including a pressure-sensitive adhesive resin or an adhesive resin. The pressure-sensitive adhesive resin or adhesive resin included in the second layer may be the same as or different from the above-described encapsulating resin, and may be suitably selected by one of ordinary skill in the art according to a purpose. In addition, each of the first and second layers may or may not include a moisture absorbent.

In one example, the adhesive resin included in the second layer may exhibit an adhesive property as a result of curing, and include a curable resin including at least one heat-curable functional group such as a glycidyl group, an isocyanate group, a hydroxyl group, a carboxyl group or an amide group, or at least one electromagnetic wave-curable functional group such as an epoxide group, a cyclic ether group, a sulfide group, an acetal group or a lactone group, which may be cured to exhibit an adhesive characteristic. In addition, a specific type of such a resin may be, but is not limited to, an acryl resin, a polyester resin, an isocyanate resin, or an epoxy resin.

In the present invention, as the curable resin, an aromatic or aliphatic, or linear, or branched epoxy resin may be used. In one exemplary embodiment of the present invention, an epoxy resin containing at least two functional groups and having an epoxy equivalent of 180 to 1,000 g/eq may be used. When the epoxy resin having the above range of epoxy equivalent is used, characteristics of the cured product such as adhesive performance and a glass transition temperature may be effectively maintained. Such an epoxy resin may be one or a mixture of at least one of a cresol novolac epoxy resin, a bisphenol A-type epoxy resin, a bisphenol A-type novolac epoxy resin, a phenol novolac epoxy resin, a tetrafunctional epoxy resin, a biphenyl-type epoxy resin, a triphenol methane-type epoxy resin, an alkyl-modified triphenol methane epoxy resin, a naphthalene-type epoxy resin, a dicyclopentadiene-type epoxy resin, and a dicyclopentadiene modified phenol-type epoxy resin.

In an exemplary embodiment of the present invention, the second layer may include another component such as the above-described active energy ray-polymerizable compound, radical initiator, tackifier, moisture absorbent, moisture blocker, dispersing agent or silane compound, which may be the same as or different from that of the first layer, in addition to the above-described resin. In addition, the second layer may include a curable material, a curing agent, or a filler in a suitable range of content according to a desired physical property.

A sequence of laminating the first and second layers is not particularly limited, and thus the second layer may be formed on the first layer, or the first layer may be formed on the second layer. Alternatively, the pressure-sensitive adhesive film may be formed of at least three layers, and for example, the first layer may include at least two layers, or the second layer may include at least two layers.

In one example, the pressure-sensitive adhesive film may include a barrier film is formed on one surface of a pressure-sensitive adhesive. The barrier film may be formed of any material generally used in the art without limitation. For example, here, the barrier film may include a base layer, an organic undercoating layer, an inorganic deposition layer and an organic top-coating layer, and the organic top-coating layer may be in contact with the pressure-sensitive adhesive.

In addition, the pressure-sensitive adhesive film may have an excellent light transmittance with respect to the visible-ray region. In one example, the pressure-sensitive adhesive film of the present invention may have a light transmittance of 85% or more with respect to the visible-ray region. For example, the pressure-sensitive adhesive film may have a light transmittance of 85, 87, or 90% or more with respect to the visible-ray region. In addition, the pressure-sensitive adhesive film may have excellent light transmittance and low haze. In one example, the pressure-sensitive adhesive film may have a haze of 3, 2, 1, 0.8, 0.5, or 0.3% or less. The pressure-sensitive adhesive according to the present invention may realize excellent reliability at a high temperature and an excellent optical characteristic by limiting the dimension variation with respect to the longitudinal direction of the film within in a specific range.

The pressure-sensitive adhesive film may further include a base film or release film (hereinafter, can be referred to as a "first film"), and have a structure in which the pressure-sensitive adhesive is formed on the base or release film. The structure may further include a base or release film formed on the pressure-sensitive adhesive (hereinafter, can be referred to as a "second film").

FIGS. 1 and 2 are cross-sectional views of exemplary pressure-sensitive adhesive films.

A pressure-sensitive adhesive film 1, as shown in FIG. 1, may include a pressure-sensitive adhesive 11 formed on a base or release film 12. Another exemplary pressure-sensitive adhesive film 2, as shown in FIG. 2, may further include a base or release film 21 formed on the pressure-sensitive adhesive 11. Although not shown in FIGS. 1 and 2, the pressure-sensitive adhesive film may also have the pressure-sensitive adhesive composition without a supporting base such as a base or release film, and therefore have a structure only including a pressure-sensitive adhesive formed in a film or sheet maintaining a solid phase or a semi-solid phase at room temperature, or a structure in which a pressure-sensitive adhesive is formed on both surfaces of one base or release film.

A specific type of the first film is not particularly limited. As the first film, for example, a plastic film may be used. The first film may be a polyethyleneterephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film, or a polyimide film.

When the first film is a release film, a suitable release treatment may be performed on one or both surfaces of such a plastic film. As a releasing agent used for a release treatment, an alkyd-based releasing agent, a silicon-based releasing agent, a fluorine-based releasing agent, an unsaturated ester-based releasing agent, a polyolefin-based releasing agent, or a wax-based releasing agent may be used. In consideration of heat resistance, an alkyd-based releasing agent, a silicon-based releasing agent, or a fluorine-based releasing agent among the above examples may be conventionally used, but the present invention is not limited thereto.

As the first film, for example, a plastic film in which a gas barrier layer is formed on a top or side surface of a base may be used. Such a film may directly constitute, for example, a substrate of an organic electronic device to be used for realizing a flexible element.

A type of the second film is not particularly limited, either. For example, as the second film, one that is the same as or different from the first films illustrated in the categories of the first film described above may be used.

A thickness of the first or second film is not particularly limited. In one example, the thickness of the first film may be approximately 50 to 500 or 100 to 200 μm. In such a range, a process of preparing or manufacturing a pressure-sensitive adhesive or an organic electronic device may be effectively automated, and advantageous effects in terms of economic feasibility may be achieved.

The thickness of the second film is not particularly limited, either. For example, the thickness of the second film may be the same as, or relatively smaller or larger than that of the first film.

The pressure-sensitive adhesive of the pressure-sensitive adhesive film includes the pressure-sensitive adhesive composition, and has a film or sheet form. In the pressure-sensitive adhesive, the pressure-sensitive adhesive composition may or may not be crosslinked. The pressure-sensitive adhesive may be in a solid or semi-solid phase at room temperature. Such a pressure-sensitive resin may form a crosslinking structure in an encapsulation structure of an organic electronic element, which will be described below.

A thickness of the pressure-sensitive adhesive is not particularly limited, and may be suitably selected in consideration of its uses. For example, the pressure-sensitive adhesive layer may have a thickness of approximately 5 to 200 μm. The thickness of the pressure-sensitive adhesive may be controlled in consideration of, for example, embedability when being used as an encapsulant of an organic electronic element and processability or economic feasibility.

In another aspect, the present invention provides a method of manufacturing a pressure-sensitive adhesive film. The exemplary pressure-sensitive adhesive film may be manufactured by plasticizing the pressure-sensitive adhesive composition in a film or sheet.

In one example, the method may include applying a coating solution including the pressure-sensitive adhesive composition on a base or release film in the form of a sheet or film, and drying the applied coating solution. The method may further include adhering an additional base or release film to the dried coating solution.

The coating solution including the pressure-sensitive adhesive composition may be prepared by, for example, dissolving or dispersing components of the pressure-sensitive adhesive composition described above in a suitable solvent. In one example, the pressure-sensitive adhesive composition may be prepared by dissolving or dispersing the moisture absorbent, blocker, or filler in a solvent when needed, grinding the resulting product, and mixing the moisture absorbent, blocker, or filler with an encapsulating resin.

A type of a solvent used in preparation of the coating solution is not particularly limited. However, when the time to dry the solvent is too long, or it is necessary to dry the solvent at a high temperature, there may have some problems in workability or durability of a pressure-sensitive adhesive film. For this reason, a solvent having a volatile temperature of 150° C. or less may be used. In consideration of film moldability, a small amount of the solvent having the above range of the volatile temperature may be used. The solvent may be, but is not limited to, one or at least two of methylethylketone (MEK), acetone, toluene, dimethyl formamide (DMF), methyl cellosolve (MCS), tetrahydrofuran (THF), xylene, and N-methylpyrrolidone (NMP).

A method of applying the coating solution to the base or release film may be, but is not particularly limited to, a known coating method such as knife coating, roll coating, spray coating, gravure coating, curtain coating, comma coating, or lip coating.

The applied coating solution may be dried to volatilize the solvent, thereby forming a pressure-sensitive adhesive. The drying may be performed, for example, at 70 to 150° C. for 1 to 10 minutes. The drying condition may be changed in consideration of a type of the used solvent.

After drying, an additional base or release film may be formed on the pressure-sensitive adhesive layer.

In still another aspect, the present invention provides a product for encapsulating an organic electronic device. The product for encapsulating an organic electronic device may include a substrate; an organic electronic element formed on the substrate; and a pressure-sensitive adhesive film encapsulating an entire surface, for example, both top and side surfaces of the organic electronic element. The pressure-sensitive adhesive film may include a pressure-sensitive adhesive containing a pressure-sensitive adhesive composition in a crosslinked state. The product for encapsulating an organic electronic device may further include a cover substrate formed on a top surface of the pressure-sensitive adhesive.

Here, the organic electronic element may be, for example, an organic light emitting element, and in one example, may be a top-emissive organic light emitting element.

In another aspect, the present invention provides a method of manufacturing an organic electronic device. The product for encapsulating an organic electronic device may be manufactured using, for example, the pressure-sensitive adhesive film.

The pressure-sensitive adhesive may be formed as an encapsulating layer for a structure exhibiting excellent moisture barrier property and optical property in the organic electronic device, effectively fixing and supporting the substrate and a cover substrate.

In addition, the pressure-sensitive adhesive may exhibit excellent transparency, and may be formed as a stable pressure-sensitive adhesive layer regardless of a type of the organic electronic device, for example, a top-emissive or bottom-emissive organic electronic device.

The term "encapsulating layer" used herein may refer to a pressure-sensitive adhesive covering both top and side surfaces of the organic electronic element.

FIG. 3 is a schematic diagram of an exemplary organic electronic device in which an organic electronic element is an organic light emitting element.

To manufacture the organic electronic device, for example, applying the above-described pressure-sensitive adhesive film to the substrate on which the organic electronic element is formed in order to cover the organic electronic element; and curing the pressure-sensitive adhesive film may be included.

The term "curing" used herein may refer to preparing a pressure-sensitive adhesive by forming the pressure-sensitive adhesive composition of the present invention to have a crosslinking structure through heating or UV irradiation.

Specifically, an organic electronic element 32 may be formed by forming a transparent electrode on a glass or polymer film 31 used as a substrate by a method such as vacuum deposition or sputtering, forming layers of emissive organic materials, composed of, for example, a hole transport layer, an emitting layer and an electron transport layer on the transparent electrode, and further forming an electrode layer thereon. Subsequently, a pressure-sensitive adhesive of the pressure-sensitive adhesive film is disposed to cover an entire surface of the organic electronic element 32 of the substrate 31 subjected to the above-described process.

Subsequently, an encapsulating layer may be formed by compressing the pressure-sensitive adhesive on the organic electronic element using a laminator while heating the pressure-sensitive adhesive layer to provide mobility as needed, and crosslinking a resin in the pressure-sensitive adhesive.

In one example, a pressure-sensitive adhesive 33 disposed to cover an entire surface of the organic electronic element 32 may be previously transferred to a cover substrate 34 such as a glass or a polymer film. The transfer of the pressure-sensitive adhesive to the cover substrate 34 may be performed using a vacuum press or vacuum laminator while being heated in a state in which the pressure-sensitive adhesive is in contact with the cover substrate 34, after peeling a first or second film from the pressure-sensitive adhesive film. When a pressure-sensitive adhesive includes a heat-curable pressure-sensitive adhesive resin, and a curing reaction is excessively performed during the process, a cohesive strength or pressure-sensitive adhesive strength of the encapsulating layer is probably reduced. Therefore, a process temperature may be controlled to approximately 100° C. or less, and a process time may be controlled to be within 5 minutes.

An encapsulating layer may be formed by disposing the cover substrate 34 to which the pressure-sensitive adhesive is transferred on the organic electronic element 32, and performing the heat compression process.

An encapsulating layer may be formed by curing the pressure-sensitive adhesive 33. The curing process may be performed in a suitable heating chamber or UV chamber, for example, according to a method of curing a curable pressure-sensitive adhesive resin. A heating condition or a condition of irradiating an active energy ray maybe suitably selected in consideration of stability of the organic electronic element and curability of the pressure-sensitive adhesive resin, and to increase compression efficiency, autoclaving may also be performed with an application of heat and pressure.

Here, one example of the method of manufacturing an organic electronic device has been described, but the organic electronic device may be manufactured by a different method. For example, while the manufacture of the device is performed by the above-described method, but a sequence or condition of the process may be changed. For example, the encapsulating layer may be formed by previously transferring the pressure-sensitive adhesive to the substrate 31, not to the cover substrate 34, and performing a curing process while the cover substrate 34 is laminated.

Effects

The present invention provides a pressure-sensitive adhesive film which can effectively block moisture or oxygen from penetrating into an organic electronic device from an external environment, and have reliability under severe conditions such as high temperature and high humidity and excellent optical characteristics.

Figure 1:
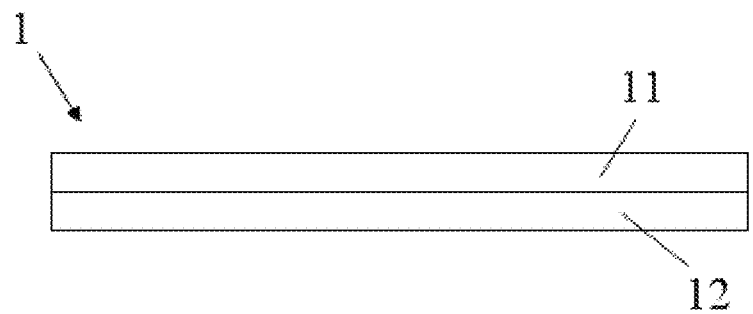
FIGS. 1 and 2 are cross-sectional views of pressure-sensitive adhesive films according to exemplary embodiments of the present invention.
Figure 2:
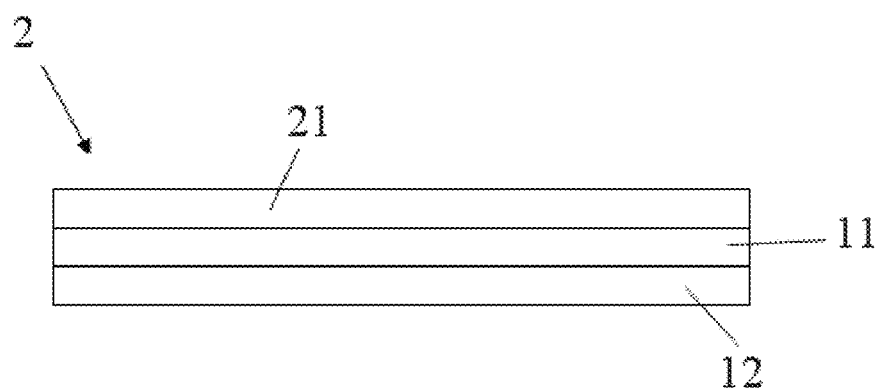
Figure 3:
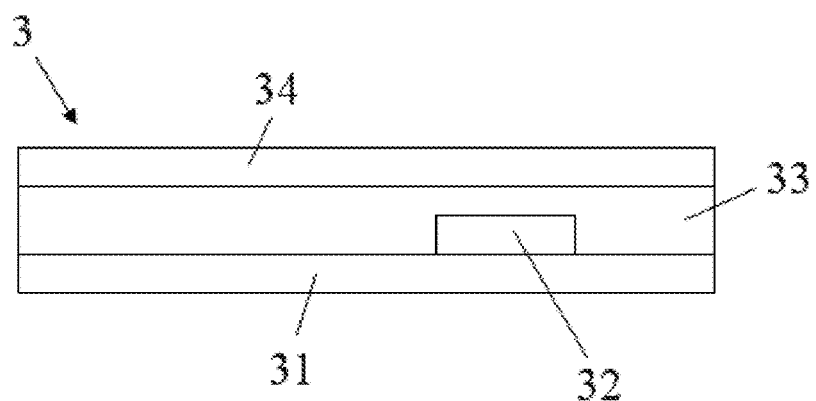
FIG. 3 is a cross-sectional view of a product for encapsulating an organic electronic device according to an exemplary embodiment of the present invention.

DESCRIPTION OF REFERENCE NUMERALS 1, 2: pressure-sensitive adhesive film
11: pressure-sensitive adhesive
12: first film
21: second film
3: organic electronic device
31: substrate
32: organic electronic element
33: pressure-sensitive adhesive or encapsulating layer
34: cover substrate

DETAILED DESCRIPTION OF EXEMPLARY EMBODIMENTS

Hereinafter, the present invention will be described in detail with reference to Examples and Comparative Examples, but the scope of the present invention is not limited to the following Examples.

EXAMPLE 1

A coating solution was prepared by adding 90 g of a butyl rubber (Br268, EXXON) as an encapsulating resin, 10 g of a hydrogenated DCPD-based tackifier resin (SU-525, Kolon) as a tackifier, 6 g of tricyclodecane dimethanol diacrylate (SR833S, Sartomer) as an active energy ray-polymerizable compound, 3 g of 3-methacryloxypropyl trimethoxysilane (Sigma Aldrich.) as a silane compound, and 0.5 g of 2,2-dimethoxy-1,2-diphenylethane-1-one (Irgacure651, Ciba) as a radical initiator, and diluting the mixture in toluene to have a solid content of approximately 20 wt %.

The prepared solution was coated on a released surface of release polyethyleneterephthalate (PET), and dried in an oven at 100° C. for 15 minutes, thereby manufacturing a pressure-sensitive adhesive film including a pressure-sensitive adhesive layer having a thickness of 20 μm. Physical properties of the sample were measured after UV rays were irradiated at 2 J/cm$^2$ onto the manufactured film.

EXAMPLE 2

A pressure-sensitive adhesive film was manufactured by the same method as described in Example 1, except that 10 g of tricyclodecane dimethanol diacylate was used.

EXAMPLE 3

A pressure-sensitive adhesive film was manufactured by the same method as described in Example 1, except that 20 parts by weight of CaO (Aldrich) was further included as a moisture adsorbent relative to 100 parts by weight of an encapsulating resin and a tackifier resin.

COMPARATIVE EXAMPLE 1

A pressure-sensitive adhesive film was manufactured by the same method as described in Example 1, except that 90 g of butyl acrylate and 10 g of acrylic acid were used instead of the butyl rubber and hydrogenated DCPD-based tackifier resin.

COMPARATIVE EXAMPLE 2

A pressure-sensitive adhesive film was manufactured by the same method as described in Example 1, except that the butyl rubber of Example 1 was replaced by B80/B10 (BASF Schweiz AG) in which a PIB resin was blended in 2:1 as an encapsulating resin.

Hereinafter, physical properties of Example and Comparative Example were evaluated by the following methods.

1. Measurement of Dimension Variation of Pressure-sensitive Adhesive Film Through TMA Analysis A sample coated with the pressure-sensitive adhesive film according to Examples or Comparative Examples was prepared to a thickness of 600 μm at room temperature. After a releasing film was removed, and the sample was cut to a size of 5 mm ×80 mm, the film was fastened to a TMA jig. When the film was treated with heat at 80° C. for 120 minutes under a load of approximately 0, a dimension variation with respect to a longitudinal direction of the film was measured between 40 to 120 minutes, and length variation (μm/min) per minute was represented as S.

2. Water Vapor Transmission Rate (WVTR)

A resin composition was prepared by dissolving the resin used in Examples or Comparative Examples in a solvent. The resin composition was applied to a base film (release polyester film, RS-21G, SKC) having a thickness of 38 μm. Subsequently, the composition was dried at 110° C. for 10 minutes, thereby forming a film-type layer having a thickness of 100 μm. Afterward, the base film was peeled, and then a WVTR of the film-type layer was measured in a thickness direction, while the layer was maintained at 100° F. and a relative humidity of 100%. The WVTR was measured according to a specification of ASTM F1249.

3. Evaluation of Reliability

A specimen was manufactured by laminating the film manufactured in Examples or Comparative Examples on a barrier film (serving as a cover substrate), laminating a polarizing plate on the barrier film, laminating the resulting laminate between glass substrates, and compressing the resulting product with a pressure and heat using an autoclave at 50° C. under 5 atm. Afterward, the specimen was maintained at 80° C. for 240 hours, and then whether lifting or bubbling was generated at an interface between the glass substrate and the pressure-sensitive adhesive layer was observed. When being viewed with the naked eye, at the interface between the glass substrate and the pressure-sensitive adhesive, if at least one of lifting or bubbling was generated, it was represented as X, and if neither lifting nor bubbling was generated, it was represented as O.

TABLE 1

|  | S (μm/min) | Evaluation of reliability | WVTR (g/m² · day) |
|---|---|---|---|
| Example 1 | 0.36 | ◯ | 3 |
| Example 2 | 0.22 | ◯ | 3 |
| Example 3 | 0.63 | ◯ | 5 |
| Comparative Example 1 | 0.58 | ◯ | 1200 |
| Comparative Example 2 | 3.98 | X | 3 |

In Comparative Examples 1 and 2, due to excellent reliability at a high temperature, there was no bubbling and moisture permeability was low, but in Comparative Example 1, moisture permeability was considerably higher, and in Comparative Example 2, reliability at a high temperature was considerably lower.

What is claimed is:

1. A pressure-sensitive adhesive film satisfying Equation 1, comprising:

a pressure-sensitive adhesive having a water vapor transmission rate of 50 g/m²·day or less in a thickness direction, wherein the water vapor transmission rate is measured according to a specification of ASTM F1249:

$$S \leq 3.5 \ \mu m/min \quad \text{[Equation 1]}$$

wherein S is a dimension variation with respect to a longitudinal direction of the film between 40 to 120 minutes, which is measured through thermomechanical analysis (TMA) when the film laminated to a thickness of 600 μm is treated with heat at 80° C. for 120 minutes, wherein the pressure-sensitive adhesive comprises a pressure-sensitive adhesive composition comprising: an encapsulating resin which is a polyolefin-based resin or elastomer; and a multifunctional active energy ray-polymerizable compound which is included at 5 to 18 parts by weight relative to 100 parts by weight of the encapsulating resin, wherein the encapsulating resin forms a crosslinking structure with the multifunctional active energy ray-polymerizable compound, wherein the multifunctional active energy ray-polymerizable compound satisfies Formula 1:

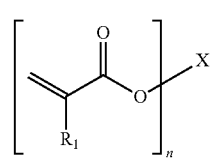

[Formula 1]

where $R_1$ is hydrogen or an alkyl group having 1 to 4 carbon atoms, n is an integer of 2 or more, and X is a residue derived from a cyclic alkyl group having 3 to 30 carbon atoms, and wherein the pressure-sensitive adhesive film has a gel content represented by Equation 1 of 50% or more:

$$\text{Gel content } (\%) = B/A \times 100 \quad \text{[Equation 1]}$$

wherein, in Equation 1, A is a mass of the pressure-sensitive adhesive, and B is a dry mass of an insoluble content of the pressure-sensitive adhesive remaining after being dipped in toluene at 60° C. for 24 hours and filtered through a 200-mesh filter (pore size of 200 μm).

2. The film according to claim 1, wherein the polyolefin-based resin or elastomer is a copolymer of a diene and an olefin-based compound including one carbon-carbon double bond.

3. The film according to claim 1, wherein the pressure-sensitive adhesive composition further comprises a silane compound satisfying Formula 2:

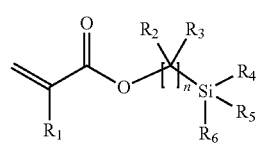

[Formula 2]

where $R_1$ is hydrogen or an alkyl group, $R_2$ and $R_3$ are each independently hydrogen, or a linear, branched or cyclic alkyl group, or $R_2$ is linked with $R_3$, thereby forming a cyclic alkyl group, $R_4$, $R_5$ and $R_6$ are each independently hydrogen, an alkyl group or an alkoxy group, at least one of $R_4$, $R_5$, and $R_6$ is an alkoxy group, and n is an integer of 1 or more.

4. The film according to claim 3, wherein the silane compound satisfying Formula 2 is included at 0.1 to 10 parts by weight relative to 100 parts by weight of the encapsulating resin.

5. The film according to claim 1, wherein the pressure-sensitive adhesive composition further comprises a tackifier.

6. The film according to claim 5, wherein the tackifier is a hydrogenated cyclic olefin-based polymer.

7. The film according to claim 5, wherein the tackifier is included at 5 to 100 parts by weight relative to 100 parts by weight of the encapsulating resin.

8. The film according to claim 1, wherein the pressure-sensitive adhesive composition further comprises a radical initiator.

9. The film according to claim 7, wherein the radical initiator is included at 0.2 to 20 parts by weight relative to 100 parts by weight of the active energy ray-polymerizable compound.

10. The film according to claim 1, wherein the pressure-sensitive adhesive composition further comprises a moisture absorbent.

11. The film according to claim 1, comprising:
a first layer comprising the pressure-sensitive adhesive and a second layer comprising a pressure-sensitive adhesive resin or an adhesive resin.

12. The film according to claim 1, which has a light transmittance of 85% or more with respect to the visible-ray region.

13. The film according to claim 1, which has a haze of 3% or less.

14. An organic electronic device comprising
a substrate;
an organic electronic element formed on the substrate; and
the pressure-sensitive adhesive film according to claim 1 encapsulating the organic electronic element.

15. A method of manufacturing an organic electronic device, comprising:
applying the pressure-sensitive adhesive film of claim 1 to a substrate on which an organic electronic element is formed in order to cover the organic electronic element; and
curing the pressure-sensitive adhesive film.

* * * * *